United States Patent
Seethamraju et al.

(10) Patent No.: US 8,242,849 B1
(45) Date of Patent: Aug. 14, 2012

(54) COMPENSATION FOR CRYSTAL OFFSET IN PLL-BASED CRYSTAL OSCILLATORS

(75) Inventors: Srisai R. Seethamraju, Nashua, NH (US); William J. Anker, Londonderry, NH (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 13/076,081

(22) Filed: Mar. 30, 2011

(51) Int. Cl.
*H03L 7/00* (2006.01)

(52) U.S. Cl. ............................. 331/44; 331/17

(58) Field of Classification Search ............ 331/44, 331/17
See application file for complete search history.

(56) References Cited

U.S. PATENT DOCUMENTS

| | | | |
|---|---|---|---|
| 5,451,912 A | 9/1995 | Torode | |
| 6,670,852 B1 * | 12/2003 | Hauck | 331/1 A |
| 6,806,786 B1 | 10/2004 | Lam et al. | |
| 7,042,301 B2 | 5/2006 | Sutardja | |
| 7,187,241 B2 * | 3/2007 | Hein et al. | 331/16 |
| 7,436,227 B2 | 10/2008 | Thomsen et al. | |

* cited by examiner

*Primary Examiner* — Joseph Chang
(74) *Attorney, Agent, or Firm* — Zagorin O'Brien Graham LLP

(57) ABSTRACT

A crystal offset value is stored in non-volatile memory in an oscillator device. The crystal offset value corresponds to a ratio between a rated frequency of an output of a crystal oscillator and a measured frequency of the output of the crystal oscillator. A rated divide value that corresponds to a selected frequency for an output of the oscillator device assumes the crystal oscillator operates at its rated or ideal frequency. Thus, the rated divide value corresponds to the rated frequency. The rated divide value is adjusted by the crystal offset value to generate an adjusted divide value and the adjusted divide value is used to generate an output signal of the oscillator device with the selected frequency.

20 Claims, 5 Drawing Sheets

COMPENSATION FOR CRYSTAL OFFSET IN PLL-BASED CRYSTAL OSCILLATORS

BACKGROUND

1. Field of the Invention

This invention relates to crystal oscillators and more particularly to accounting for differences among crystal oscillators.

2. Description of the Related Art

In traditional phase-locked loop (PLL) based crystal oscillator devices, slight variations in the internal crystal frequency between one crystal and another lead to a different frequency plan for each device to maintain the same output frequency. The frequency plan determines the divider values for the particular device, which in turn, determine the output frequency. Using different frequency plans for the same output frequency causes several problems. In programmable oscillators, if a customer has two oscillators on a printed circuit board or the same part on two boards that need to generate the same output frequencies, the customer has to measure/calculate the crystal frequency of each part and then calculate a separate frequency plan for each part. That is not only cumbersome, but also difficult on boards with limited processing power. For pin controlled parts, which are programmed during manufacturing for a particular frequency or frequencies that are pin selectable, a standard frequency plan cannot be used for programming the parts for the particular frequency or frequencies due to slight variations in the crystals.

SUMMARY

Accordingly, it would be desirable to address that variability and provide crystal-based oscillator devices that output the same frequency when given the same frequency plan.

Accordingly, an embodiment of the invention provides a method that includes storing in on-chip storage in an oscillator device a crystal offset value based on a ratio between a rated frequency of an output of a crystal oscillator and a measured frequency of the output of the crystal oscillator. A rated divide value is stored that corresponds to a selected frequency for an output of the oscillator device that assumes the crystal oscillator operates at its rated frequency. Thus, the rated divide value corresponds to the rated frequency. The rated divide value is adjusted by the crystal offset value to generate an adjusted divide value and the adjusted divide value is used to generate an output signal of the oscillator device with the selected frequency.

In another embodiment an apparatus is provided that includes a crystal oscillator and a crystal offset storage storing a crystal offset based on a ratio between a rated crystal oscillator output frequency and a measured crystal oscillator output frequency. A loop circuit, such as a phase-locked loop (PLL), is coupled to the crystal oscillator, and its output frequency is determined, in part, according to the crystal offset.

In another embodiment, a method of making an oscillator is provided that includes measuring a frequency of a crystal oscillator at an output terminal of an integrated circuit, determining a crystal offset based on a ratio between the rated frequency and a measured frequency of the crystal oscillator, and storing the crystal offset in non-volatile memory on the integrated circuit including at least a portion of the oscillator to thereby allow the oscillator to output a selected frequency using a frequency plan for the rated frequency of the crystal oscillator.

In another embodiment an apparatus includes a printed circuit board that has a plurality of oscillator devices. Each of the oscillator devices includes a crystal oscillator and crystal offset storage storing as a crystal offset a frequency ratio between a rated crystal oscillator output frequency of the crystal oscillator and a measured crystal oscillator output frequency of the crystal oscillator. Each oscillator device further includes a loop circuit coupled to the crystal oscillator. An output frequency of the loop circuit is determined, in part, according to the crystal offset. Each oscillator device also includes a multiplier to multiply a rated divide value by the crystal offset, the rated divide value corresponding to a divide value if the crystal frequency were at the rated value. Each of the oscillator devices is configured to utilize an identical frequency plan and each of the oscillator devices has a different crystal offset.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
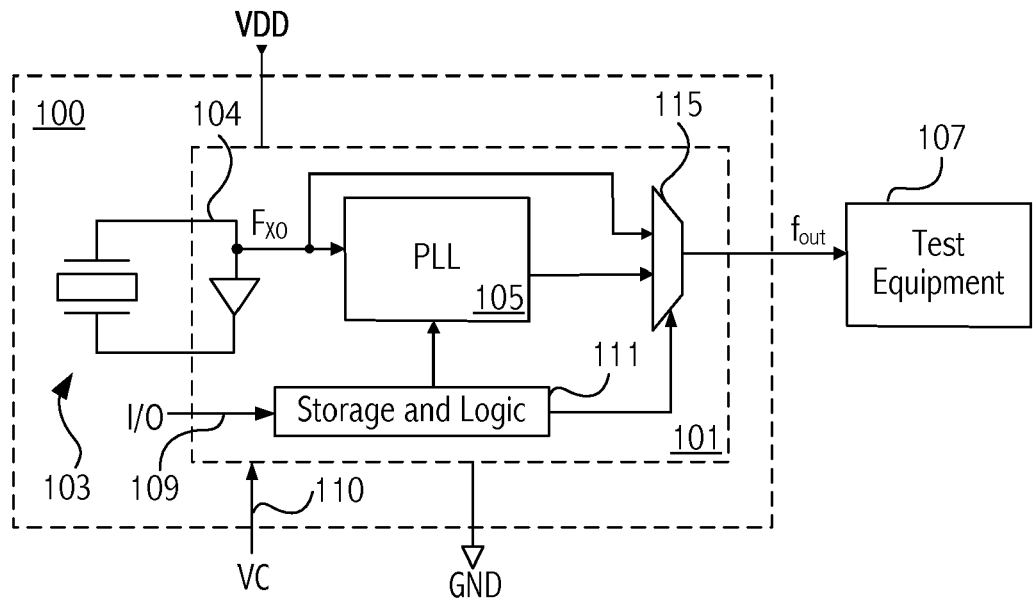
FIG. 1 illustrates a high level block diagram of an oscillator device according to an embodiment of the invention.

Referring to FIG. 1, a high level block diagram of an oscillator device 100 according to an embodiment of the invention is provided. A crystal oscillator 103 supplies an input signal 104 having a frequency of $F_{XO}$ to a PLL 105. The crystal oscillator 103 is rated at a specific frequency, e.g., 40 MHz. However, the precise frequency can vary from part to part from its rated value as a result of slight differences in the crystal. In order to account for that difference, the output of the crystal oscillator is supplied to test equipment 107. The test equipment measures the frequency of the output. A crystal offset based on a frequency ratio between the rated frequency and the measured frequency, is loaded over input/output port 109 into storage and logic block 111. That crystal offset provides a scale factor as described further herein. In other embodiments, the crystal offset may be calculated from several values stored on-chip. For example, the several values may include the arithmetic difference between the two frequencies ($F_{rated}$-$F_{measured}$) along with either the measured or rated frequency. Alternatively, the measured and rated frequency may be stored. With that information, the crystal offset may be determined on-chip, e.g., at initialization as the ratio of the two frequencies and stored in storage on-chip, e.g., in a register, for use during operation. In order to measure the frequency, the integrated circuit 101 includes a bypass mode that allows the crystal oscillator signal 104 to be selected by selector circuit 115 for outputting to the test equipment. That bypass mode may be a default setting for the integrated circuit until the storage and logic block 111 is configured to override that default setting. The storage and logic block 111 may include registers, non-volatile memory, arithmetic circuits such as multipliers, adders, and combinational logic circuits, and the like. In other embodiments, a frequency counter may be included in the integrated circuit 101 so that the frequency of the crystal oscillator is determined on-chip. In such an embodiment, PLL 105 may receive a reference frequency from a known source instead of crystal oscillator 103. Thus, a selector circuit (not shown) may be provided on the input to the PLL for use during test modes to select the known reference frequency. Further, the crystal offset based on the frequency ratio between rated and measured may be determined on or off-chip, e.g., on the test equipment or elsewhere.

In any case, a crystal offset is determined that is based on the ratio between a rated value of the crystal oscillator frequency and the measured value and that crystal offset value is used to simplify use of the oscillator device 100.

Figure 2:
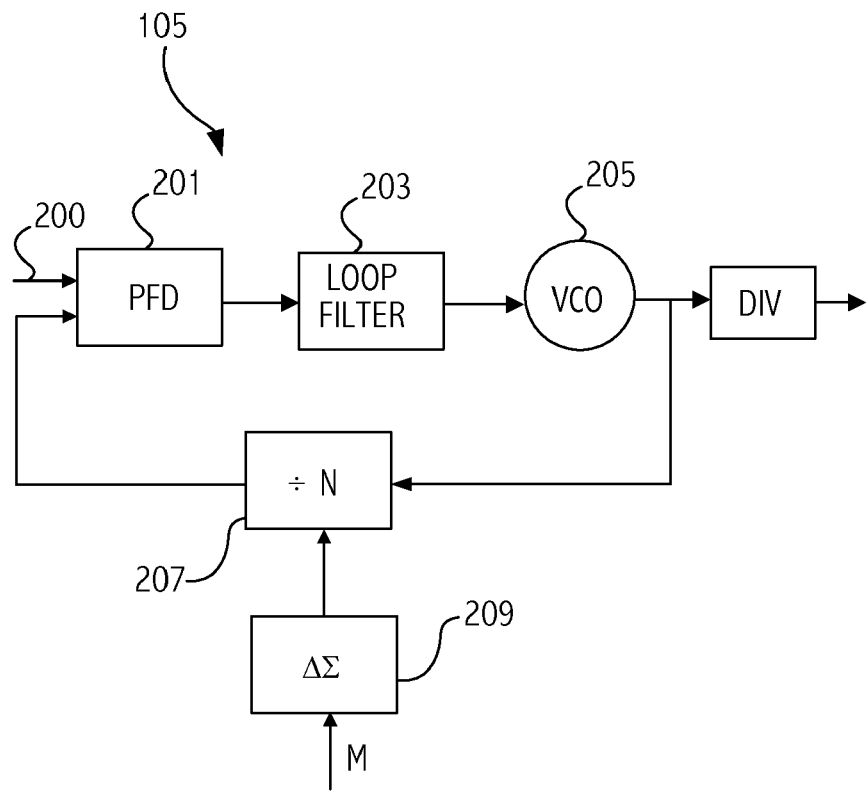
FIG. 2 illustrates an exemplary phase-locked loop (PLL) according to an embodiment of the invention.

FIG. 2 illustrates an exemplary high level diagram of an embodiment of PLL 105. The embodiment includes a phase frequency detector (PFD) 201, a loop filter 203, a voltage controlled oscillator (VCO) 205 and a feedback divider 207. The feedback divider 207 is a fractional-N feedback divider capable of dividing by different integer values. The feedback divider is controlled by a delta sigma modulator 209 that converts a desired non-integer divide value into appropriate integers for use by the divider 207. The average of the divide values supplied to the divider 207 equals the desired non-integer divide value.

Figure 3:
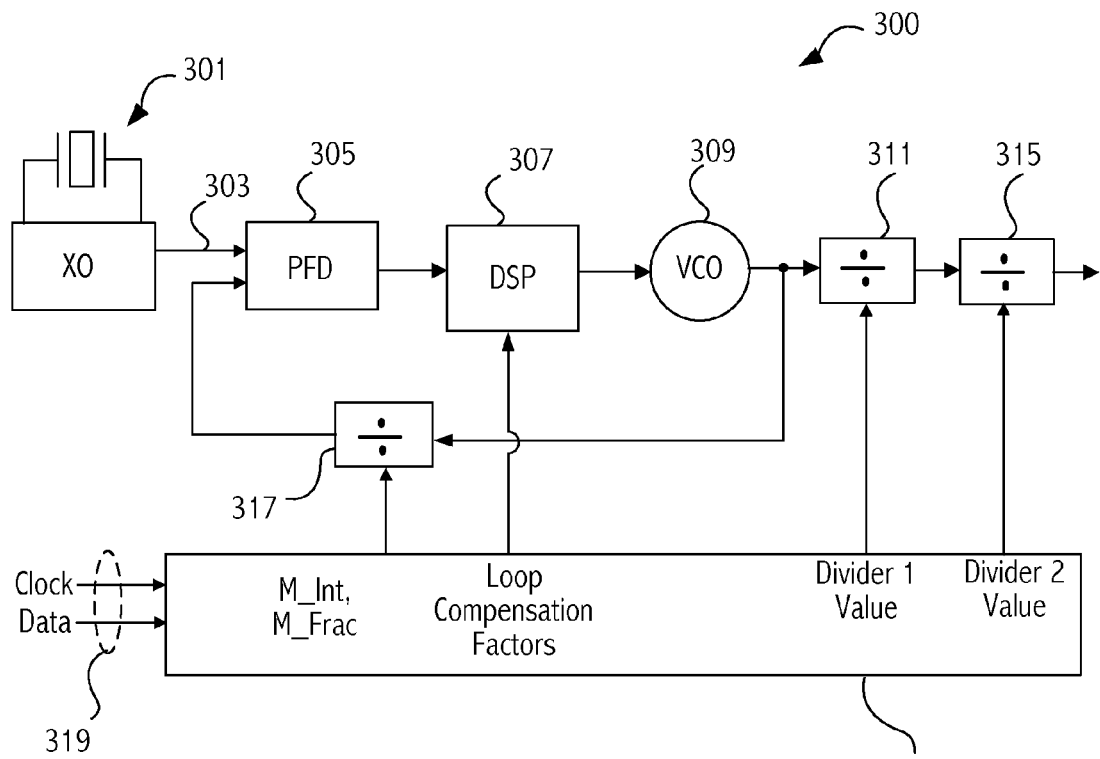
FIG. 3 illustrates a portion of an oscillator device showing how a frequency plan is applied to control the output frequency of the oscillator device according to an embodiment of the invention.

Referring to FIG. 3, an embodiment is illustrated showing a portion of an oscillator device showing how a frequency plan is applied to control the output frequency of the oscillator device 300. The crystal oscillator 301 supplies a reference clock 303 to PFD 305. A loop filter 307 is interposed between the PFD 305 and the VCO 309. Two dividers 311 and 315 divide the output of the VCO 309. The feedback signal is also supplied to the feedback divider 317. In order to select a frequency for output by the crystal-based PLL oscillator device 300, the PLL has to be set up with the divide value, specified as an integer portion (M_Int) and a fractional portion (M_frac). That divider value is supplied to a delta sigma modulator (not shown in FIG. 3) for control of divider 317. Loop compensation values are supplied to loop filter 307. The loop compensation values may be related to bandwidth or other filter parameters that may vary with frequency. Finally, the frequency plan supplies divider values for dividers 311 and 315. The frequency plan is supplied, e.g., from registers 317. The registers may be loadable over, e.g., a serial interface 319. In some embodiments the frequency plan may be pin programmable. For example, four frequency plans can be stored in non-volatile memory (NVM) in the oscillator device and two pins can be used to select one of the four plans. A serial interface may also be used to select preloaded frequency plans. In any case, the frequency plan, and particularly the divider values M_Int and M_Frac are selected assuming the crystal oscillator 301 supplies a reference frequency corresponding to the rated frequency of the crystal. The output frequency $F_{OUT}=F_{XO} \times M/DIV_1 \times DIV_2$, is determined by M, where M is the feedback divider value, and the input frequency $F_{XO}$, along with the fixed divider values $DIV_1$ and $DIV_2$. If the input frequency differs from its expected or rated value, M has to adjust to ensure the same output frequency is generated. In order to simplify the part, rather than having to specify a different M for each part to account for each crystal, it is better for the part itself, rather than the customer, to account for the difference in the crystal oscillator frequency. That way, a customer selects a frequency by assuming a rated value for the crystal oscillator frequency. Thus, oscillator devices with the same rated crystal can use the same frequency plan to output the same frequency.

Figure 4:
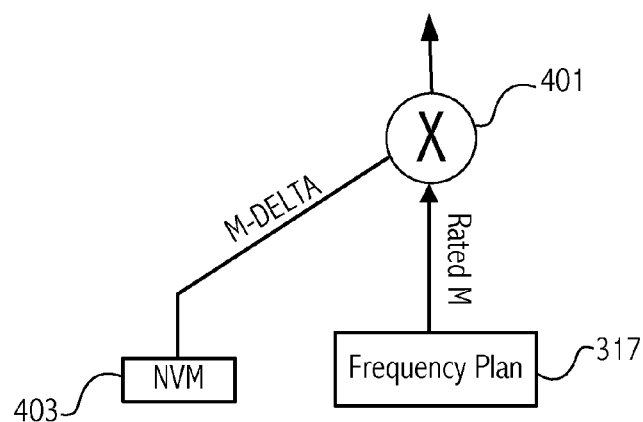
FIG. 4 illustrates an embodiment to adjust a rated divide value M by a crystal offset (M-delta) that accounts for the difference in the output frequency caused by the difference in the crystal oscillator $F_{XO}$ from a rated frequency value.

Referring to FIG. 4, an embodiment illustrates a way to adjust a rated divide value M by a crystal offset (M-delta) that accounts for the difference in the output frequency that would be caused by the difference in $F_{XO}$ from a rated value. Remembering from FIG. 1, the crystal offset value, based on the ratio between the rated crystal oscillator frequency and the measured crystal oscillator frequency, is used to scale the rated divide value. For example, the scale value shown as delta_M in FIG. 4 is supplied to a multiplier 401 from NVM 403. Note that the NVM value may be loaded into a register prior to the multiplier. The multiplier multiplies the scale factor by the rated divider value M to determine an adjusted divider value that is used to control the feedback divider. For example, the delta_M value may range from 0 to 2. In other embodiments, the value of delta_M may be limited to values more closely grouped around 1. When the value is 1, that means the crystal oscillator operates at exactly the rated value. As the value moves below or above 1, that corrects for the crystal being faster or slower than the rated value. The rated M value may be supplied from a register such as register 317 (FIG. 3).

Figure 5:
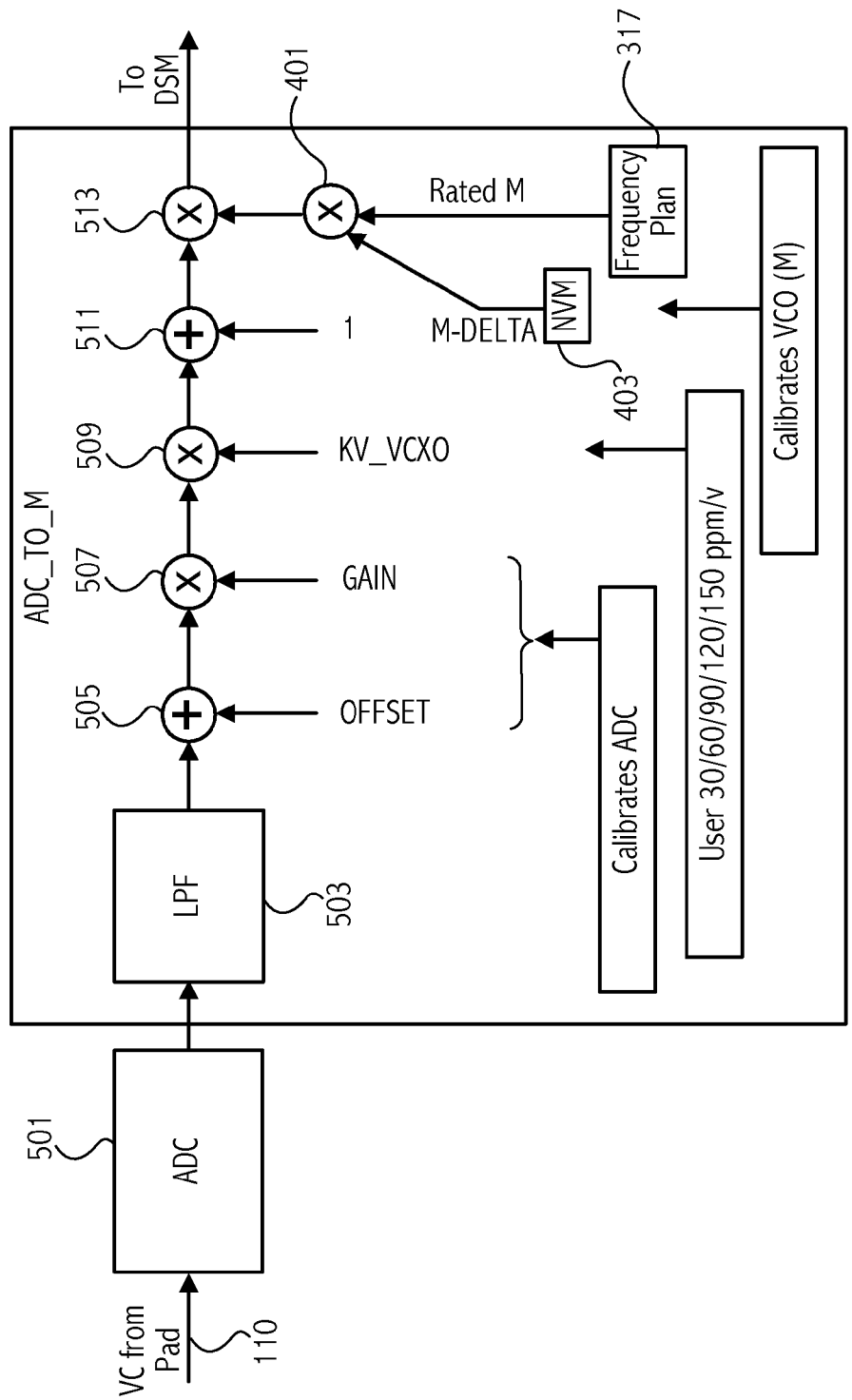
FIG. 5 illustrates how the divide values are combined with an external control voltage to control the frequency of the PLL oscillator in an embodiment of the invention.

Referring to FIG. 5, an embodiment illustrates how the divide values (rated and M-delta) are combined with a voltage from an external voltage control input that is used to adjust the frequency of the PLL oscillator. In FIG. 5, a voltage control (VC) input 110 (see also FIG. 1) is supplied to an analog to digital converter (ADC) 501. The voltage control input 110 may be used to effect small frequency changes in the output of the PLL-based oscillator. The output of the ADC 501 is filtered in low pass filter 503. An offset value is added to the low pass filter output in summer 505 to calibrate the ADC and an ADC gain correction factor is applied in a gain stage 507 to the output of the summer. In addition, a gain factor in gain stage 509 determines the desired sensitivity of the control voltage. For example, a user may be provided a selectable range of parts per million (ppm) change in frequency per volt, specified as ppm/v. Both gain stages may be implemented as multipliers since their inputs are digital. The output of gain stage 509 is a positive or negative fractional value to which a one is added in summer 511. Multiplier 513 then scales the adjusted M value (scaled in multiplier 401) by the output of the summer 511. That value is then supplied to the delta sigma modulator to control the feedback divider of the PLL.

Figure 6:
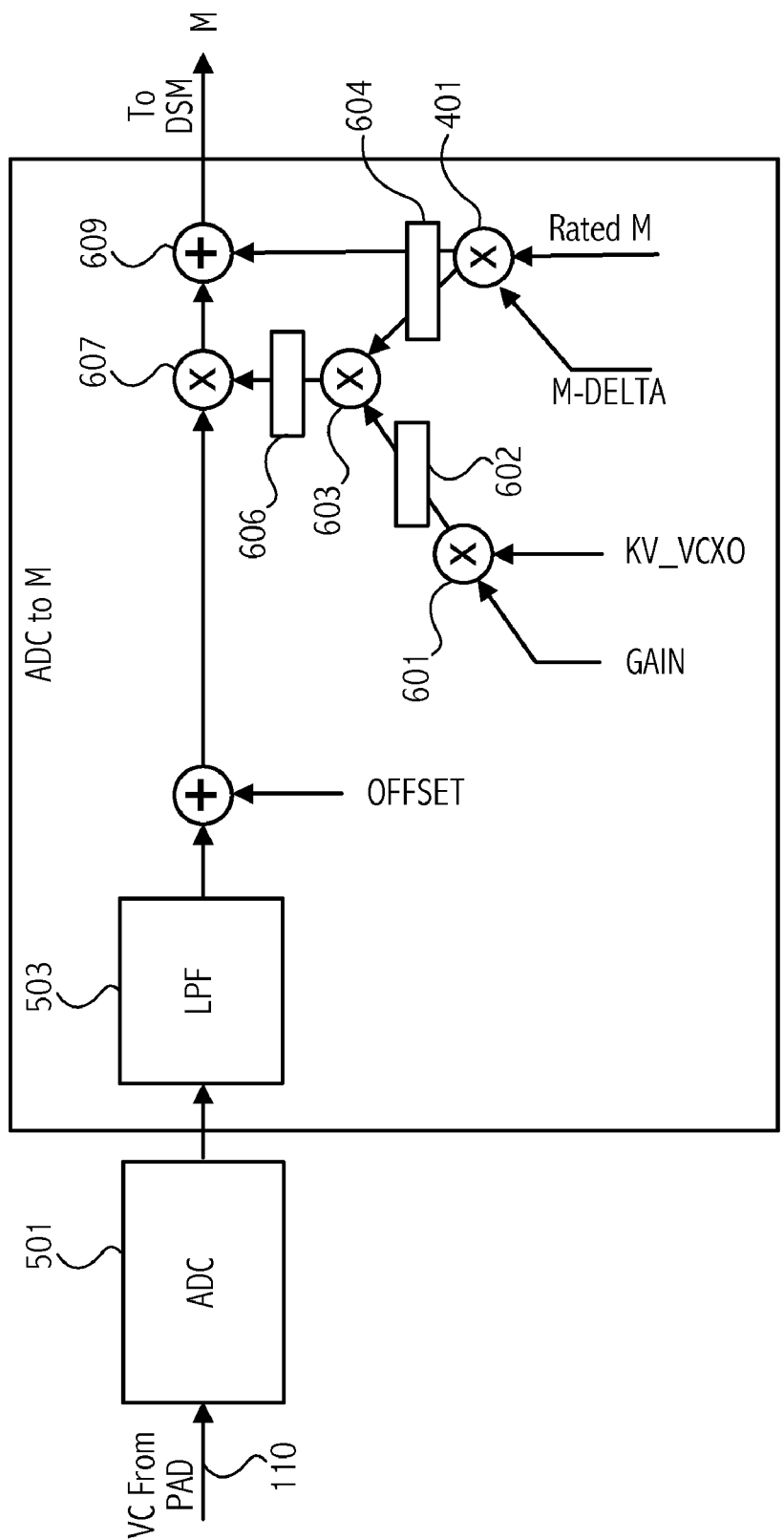
FIG. 6 illustrates how the divide values are combined with a voltage from an external voltage control used to adjust the frequency of the PLL oscillator in another embodiment of the invention.

Referring to FIG. 6, another embodiment is illustrated in which the voltage control input is supplied from the input terminal 110. Because the values GAIN, KV_VCXO, M-DELTA, and M, in FIGS. 5 and 6 are fixed, the multiplies in gain stages 507 and 509, and 401 in FIG. 5 only have to be calculated once. Thus, FIG. 6 shows multiplies 601, 603 and 401 that only have to be calculated once. In fact, those multiplies can all be calculated in the same digital multiplier sequentially. For example, multiply 601 is calculated and saved in a register 602. Multiply 401 is then calculated and saved in a register 604. Finally, multiply 603 multiplies the output of the two registers and supplies that value to register 606. That constant value is then used for the continuous update multiply in multiply 607 that multiplies the output of the ADC (with offset) by the constant value in register 606. Summer 609 sums the output of multiply 607 with register 604, and supplies the sum to the DSM as "M", the divide value for the feedback divider. That divide value has been generated using the rated divide value M, the crystal offset value (M-delta) and the voltage control input.

In embodiments without a voltage control input, the scaling of the rated divide value M by the crystal offset M-delta may be used to adjust the feedback divider based on a selected divide ratio without the need to account for frequency adjustment based on a voltage control input. That accounts for crystal variations and allows a rated divide value M to be used to specify the divide ratio rather than having to specify a separate M for each part due to crystal variations.

Figure 7:
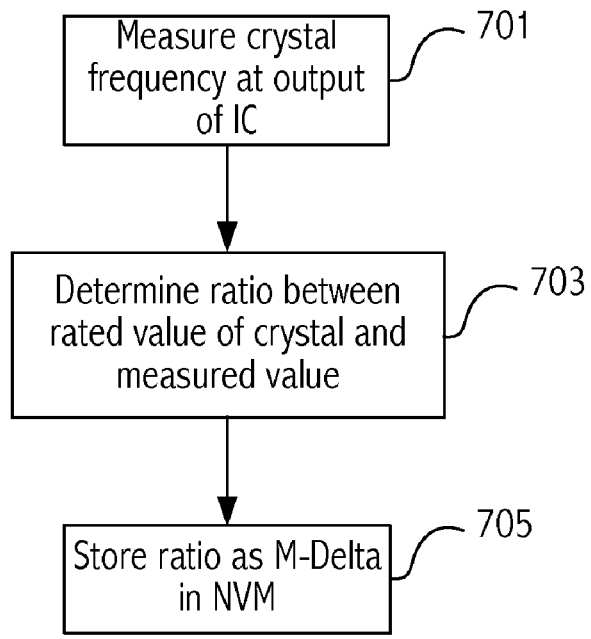
FIG. 7 illustrates a high level flow diagram of how the crystal offset is determined.

FIG. 7 illustrates a high level diagram of how the crystal offset is determined. The crystal oscillator frequency is measured in 701. That may be measured by test equipment or on-board the oscillator device. The crystal offset value based on the ratio between the rated value of the crystal oscillator and the measured value of the crystal oscillator is determined in 703 and is stored in non-volatile memory in the integrated circuit for use as a scale factor to adjust the rated divide ratio. Alternatively, the measured and rated frequencies, or the arithmetic difference between the frequencies and one of the frequencies are stored in the integrated circuit for later use to calculate the crystal offset.

Figure 8:
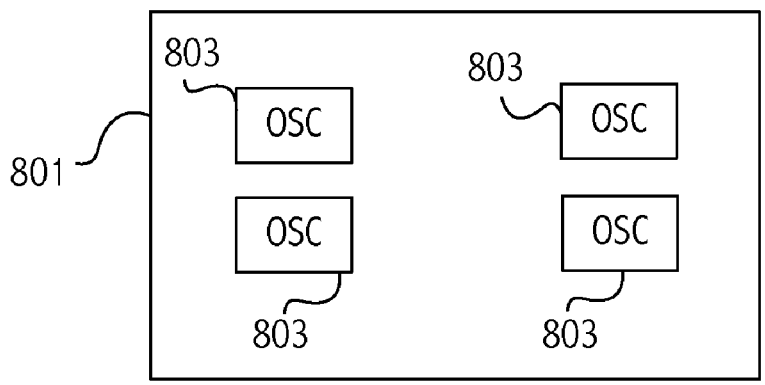
FIG. 8 illustrates an embodiment in which a printed circuit board has multiple oscillator devices utilizing the same frequency plan.

Referring to FIG. 8, illustrated is an exemplary embodiment showing a printed circuit board 801 with a plurality of oscillator devices 803 such as the ones shown and described in relation to FIGS. 1-6. In instances where multiple ones of the oscillator devices are required to provide the same frequency, although each of the oscillator devices utilizes a different crystal, the oscillator devices can utilize the same frequency plan thereby simplifying utilization of the oscillator devices 803. The frequency plan may be loaded at the factory or loaded through, e.g., a serial interface (see, e.g. 319 in FIG. 3).

The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A method comprising:
   storing in on-chip storage in an oscillator device a crystal offset value that is based on a ratio between a rated frequency of an output of a crystal oscillator and a measured frequency of the output of the crystal oscillator;
   storing a rated divide value corresponding to a selected frequency for an output of the oscillator device, the rated divide value corresponding to the rated frequency;
   adjusting the rated divide value by the crystal offset value and generating an adjusted divide value; and
   using the adjusted divide value to generate an output signal of the oscillator device with the selected frequency.

2. The method as recited in claim 1 further comprising:
   measuring the frequency of the output of the crystal oscillator;
   determining the ratio between the rated frequency and the measured frequency as the crystal offset value; and
   loading the crystal offset value into the on-chip storage.

3. The method as recited in claim 1, wherein adjusting the rated divide value comprises:
   scaling in a multiplier the rated divide value by the crystal offset.

4. The method as recited in claim 1, further comprising:
   dividing a feedback divider coupled to a voltage controlled oscillator according to the adjusted feedback divider value.

5. The method as recited in claim 1, wherein the on-chip storage is non-volatile memory.

6. The method as recited in claim 1, further comprising generating the output signal of the oscillator device with the selected frequency utilizing a phase-locked loop.

7. An apparatus comprising:
   a crystal oscillator;
   a crystal offset storage storing a crystal offset based on a ratio between a rated crystal oscillator output frequency and a measured crystal oscillator output frequency; and
   a loop circuit coupled to the crystal oscillator, a selected output frequency of the loop circuit being determined, in part, according to the crystal offset.

8. The apparatus as recited in claim 7 wherein the loop circuit is a phase-locked loop.

9. The apparatus as recited in claim 7 wherein the crystal offset storage is non-volatile memory.

10. The apparatus as recited in claim 7 wherein the crystal offset is used to generate a divider value for a feedback divider for the phase-locked loop.

11. The apparatus as recited in claim 7 wherein the feedback divider is a fractional-N divider.

12. The apparatus as recited in claim 7 further comprising:
    a multiplier to multiply a rated divide value by the crystal offset, the rated divide value corresponding to a divide value if the crystal frequency were at the rated value.

13. The apparatus as recited in claim 12 wherein the rated divide value is part of a frequency plan for the loop circuit to output the selected frequency.

14. The apparatus as recited in claim 7 wherein the apparatus includes a bypass mode on power-up and prior to programming of the apparatus, the bypass mode supplying the crystal oscillator signal to an output of the apparatus.

15. The apparatus as recited in claim 7 further comprising a voltage control terminal on the apparatus to adjust the output frequency of the loop circuit.

16. The apparatus as recited in claim 7,
    wherein the apparatus includes a package housing a crystal of the crystal oscillator and an integrated circuit die.

17. The apparatus as recited in claim 7 wherein the frequency plan is programmed through a serial interface while the apparatus is disposed on a printed circuit board.

18. The apparatus as recited in claim 7 wherein the frequency plan is stored in the device.

19. A method of making an oscillator comprising:
    measuring a frequency of a crystal oscillator at an output terminal of an integrated circuit;
    determining a crystal offset based on a ratio between a rated frequency and the measured frequency of the crystal oscillator; and
    storing the crystal offset in non-volatile memory on an integrated circuit including at least a portion of the oscil lator to thereby allow the oscillator to output a selected frequency using a frequency plan for the rated frequency of the crystal oscillator.

20. An apparatus comprising:
a printed circuit board including a plurality of oscillator devices, each of the oscillator devices including,
 a crystal oscillator;
 a crystal offset storage storing as a crystal offset a frequency ratio between a rated crystal oscillator output frequency of the crystal oscillator and a measured crystal oscillator output frequency of the crystal oscillator;
 a loop circuit coupled to the crystal oscillator, an output frequency of the loop circuit being determined, in part, according to the crystal offset; and
 a multiplier to multiply a rated divide value by the crystal offset, the rated divide value corresponding to a divide value if the crystal frequency were at the rated value;
 wherein each of the oscillator devices is configured to utilize an identical frequency plan and each of the oscillator devices has a different crystal offset.

* * * * *